US00RE41205E

(19) United States
(12) Reissued Patent
Kim

(10) Patent Number: US RE41,205 E
(45) Date of Reissued Patent: Apr. 6, 2010

(54) METHOD OF FABRICATING A SEMICONDUCTOR DEVICE

(75) Inventor: Jae-Yeong Kim, Chungcheongbuk-do (KR)

(73) Assignee: Hynix Semiconductor Inc., Kyoungki-do (KR)

(21) Appl. No.: 10/952,576

(22) Filed: Sep. 28, 2004

Related U.S. Patent Documents

Reissue of:
(64) Patent No.: 6,339,003
Issued: Jan. 15, 2002
Appl. No.: 09/609,390
Filed: Jul. 3, 2000

(30) Foreign Application Priority Data

Aug. 21, 1999 (KR) ..... 99-34743

(51) Int. Cl.
*H01L 21/8236* (2006.01)
*H01L 21/311* (2006.01)
*H01L 21/302* (2006.01)

(52) U.S. Cl. ..... 438/287; 438/637; 438/702; 438/740; 438/763; 257/E21.627

(58) Field of Classification Search ..... 438/287, 438/637, 666, 702, 740, 763; 257/E21.252
See application file for complete search history.

(56) References Cited

U.S. PATENT DOCUMENTS 4,966,870 A * 10/1990 Barber et al. ..... 438/637
5,811,343 A * 9/1998 Wann et al. ..... 438/305
5,912,188 A * 6/1999 Gardner et al. ..... 438/740
5,949,092 A * 9/1999 Kadosh et al. ..... 438/158
6,077,731 A * 6/2000 Yamazaki et al. ..... 438/150
6,159,839 A * 12/2000 Jeng et al. ..... 438/618
6,159,844 A * 12/2000 Bothra ..... 438/637
6,211,092 B1 * 4/2001 Tang et al. ..... 438/719
6,326,270 B1 * 12/2001 Lee et al. ..... 438/279
6,333,558 B1 * 12/2001 Hasegawa ..... 257/759

* cited by examiner

*Primary Examiner*—Steven J Fulk
(74) *Attorney, Agent, or Firm*—Ladas & Parry LLP

(57) ABSTRACT

[The present invention relates to a method of fabricating a semiconductor device which reduces] *The* leakage current [by controlling an etch of a field oxide layer when a contact hole is formed. The present invention includes the steps of forming a] *in a semiconductor device is reduced. A* field oxide layer [defining an active area and a field area] *is formed* on a semiconductor substrate[of a first conductive type, forming a]. *A* gate *is formed* on [the] *an* active area of the [semiconductor] substrate. [by inserting a gate insulating layer between the semiconductor] substrate and the gate, forming impurity regions [of a second conductive type in the semiconductor] *are formed on the* substrate [in use of] *using* the gate as a mask[, forming a]. *A* first insulating [interlayer] *layer is formed* on the [semiconductor] substrate by depositing an insulator [of which] *having the* heat expansion coefficient and lattice mismatch *that are* less than those of the [semiconductor] substrate[to cover the field oxide layer and the gate, forming a]. *A* second insulating [interlayer] *layer is formed* on the first insulating [interlayer] *layer* by depositing another insulator [of which] *having an* etch rate *that* is different from that of the first insulating [interlayer, forming a] *layer. A* third insulating [interlayer] *layer is formed* on the second insulating [interlayer] *layer* by depositing *yet* another insulator [of which] *having an* etch rate *that* is different from that of the second insulating [interlayer, and forming a first contact hole] *layer. First* and second contact holes [exposing the gate and heavily doped regions respectively] *are formed* by patterning the third to first insulating [interlayer successively by photolithography] *layers.*

24 Claims, 4 Drawing Sheets

FIG. 2B
(AMENDED)
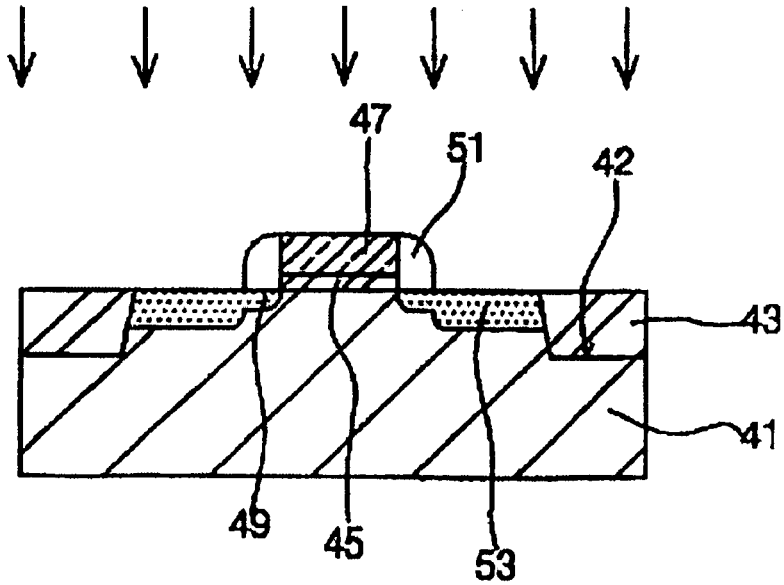

METHOD OF FABRICATING A SEMICONDUCTOR DEVICE

Matter enclosed in heavy brackets [ ] appears in the original patent but forms no part of this reissue specification; matter printed in italics indicates the additions made by reissue.

BACKGROUND OF THE INVENTION

1. Field of Invention

The present invention relates to a method of fabricating a semiconductor device which reduces leakage current by controlling an etch of a field oxide layer when a contact hole is formed.

2. Discussion of Related Art

As the integration of a semiconductor device increases, so the size of an unit transistor decreases. Thus, sizes of contact holes exposing impurity regions are reduced as well as the impurity regions for source and drain regions are decreased in size, causing difficulty in process. Besides, leakage current on the operation of the device is brought about by the etch of a field oxide layer due to misalignment in forming the contact holes.

Therefore, a technique of forming a borderless contact has been developed to reduce leakage current by forming the contact hole to be overlapped with a field oxide layer, which provides an easy process and prevents the etch of the field oxide layer.

FIG. 1A to FIG. 1D show cross-sectional views of fabricating a semiconductor device according to a related art.

Figure 1A:
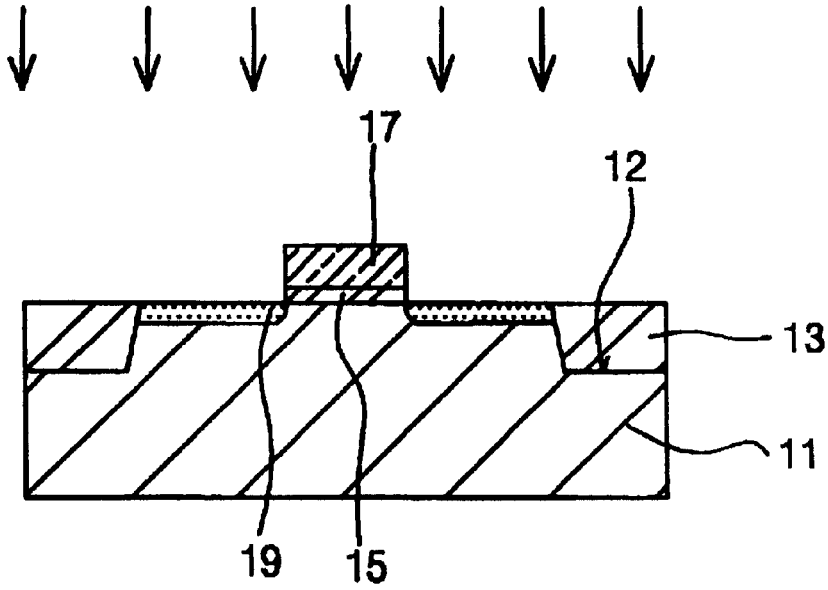
FIG. 1A RELATED ART

Referring to FIG. 1A, a field oxide layer 13 defining an active area and a field area of a device is formed on a p-typed semiconductor substrate 11 by shallow trench isolation (hereinafter abbreviated STI). In this case, the field oxide layer 13 is formed by forming a pad oxide layer(not shown in the drawing) and a mask layer(not shown in the drawing) which expose the field area on the semiconductor substrate 11, by forming trenches 12 which are slant to a predetermined degree by carrying out an anisotropic etch such as reaction ion etching(hereinafter abbreviated RIE) and the like on the exposed parts of the semiconductor substrate 11, by filling the trenches with silicon oxide, then by removing the pad oxide and mask layers.

After a gate oxide layer 15 has been formed on the active area of the semiconductor substrate 11, polysilicon doped with impurities is deposited on the gate insulating layer 15 by chemical vapor deposition(hereinafter abbreviated CVD). Then, a gate 17 is formed by patterning the polysilicon to remain on a predetermined portion of the semiconductor substrate 11 by photolithography including anisotropic etches such as RME and the like.

Lightly doped regions 19 for LDD(lightly doped drain) regions are formed by implanting ions lightly into the exposed portions of the semiconductor substrate 11 with n typed impurities in use of the gate 17 as a mask.

Figure 1B:
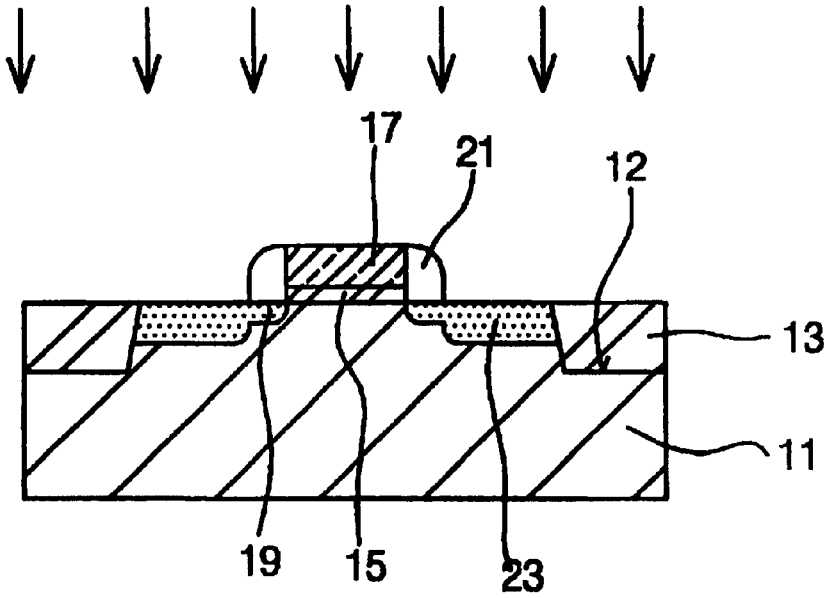
FIG. 1B RELATED ART

Referring to FIG. 1B, a sidewall spacer 21 is formed at the sides of the gate 17. In this case, the sidewall spacer 21 is formed by deposing silicon oxide on the semiconductor substrate 11 to cover the field oxide layer 13 and gate 17 by CVD, then by etching back the silicon oxide to have the semiconductor substrate 11 exposed by RIE.

Heavily doped regions 23 for a source and a drain region are formed by implanting with n typed impurity ions heavily into the exposed portions of the semiconductor substrate 11 in use of the gate 17 and sidewall spacer 21 as a mask.

Figure 1C:
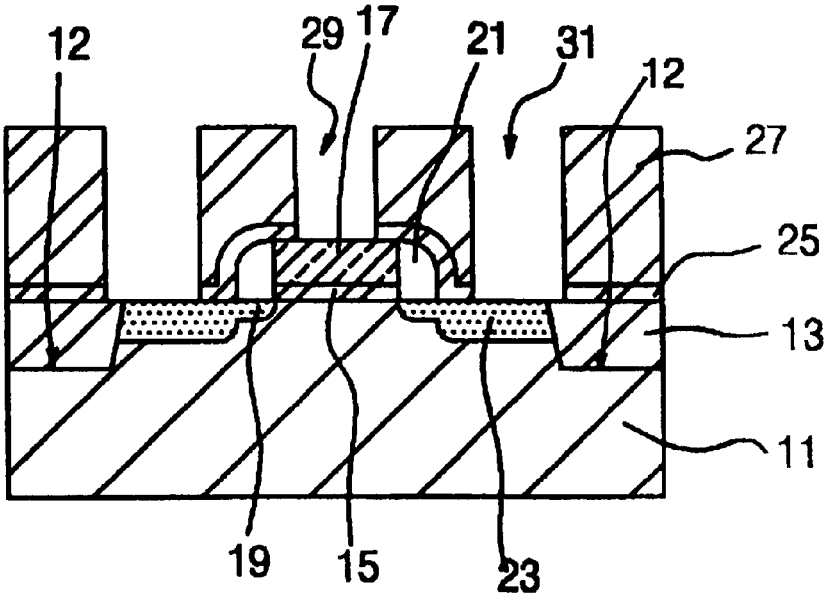
FIG. 1C RELATED ART

Referring to FIG. 1C, a first insulating [interlayer] *layer* 25 is formed by depositing silicon nitride on the semiconductor substrate 11 *by CVD* to cover the field oxide layer 13, gate 17, and sidewall [spacer] *spacers* 21 by CVD. [And, a] *A* second insulating [interlayer] *layer* 27 is formed by depositing silicon oxide or BPSG (boro phospho silicate glass) on the first insulating [interlayer] *layer* 25 *to a substantial thickness* by CVD or by coating *SOG* (*spin on glass*) the first insulating [interlayer] *layer* 25 [with SOG(spin on glass)].

[A first and a] *First and* second contact [hole] *holes* 29 and 31 *respectively* exposing the gate *17* and heavily doped regions 23 [respectively] are formed by patterning the second and first insulating [interlayers] *layers* 27 and 25 by photolithography including anisotropic [etch] *etching* such as RIE and the like. As the thickness of the second insulating [interlayer] *layer* 27 is irregular due to [the] *a* height difference between the gate 17 and heavily doped regions 23, the first and second contact holes 29 and 31 are formed by *sufficiently* etching, *that is overetching* the second insulating [interlayer] *layer* 27 sufficiently, which means that the second insulating [interlayer] *layer* 27 is overetched to expose *portions of* the first insulating [interlayer] *layer* 25 [corresponding] *which correspond* to the heavily doped regions 23, *and* then by etching the first insulating [interlayer] *layer* 25.

[In this case, as the] *At this time, since an* etch rate of the first insulating [interlayer] *layer* 25 is different from that of the second insulating [interlayer] *layer* 27, the first insulating [interlayer] *layer* 25 *serves* as an etch stop layer *and* prevents the field oxide layer 13 from being etched [in spite of] *even when sufficiently* etching the second insulating [interlayer] *layer* 27[sufficiently].

Figure 1D:
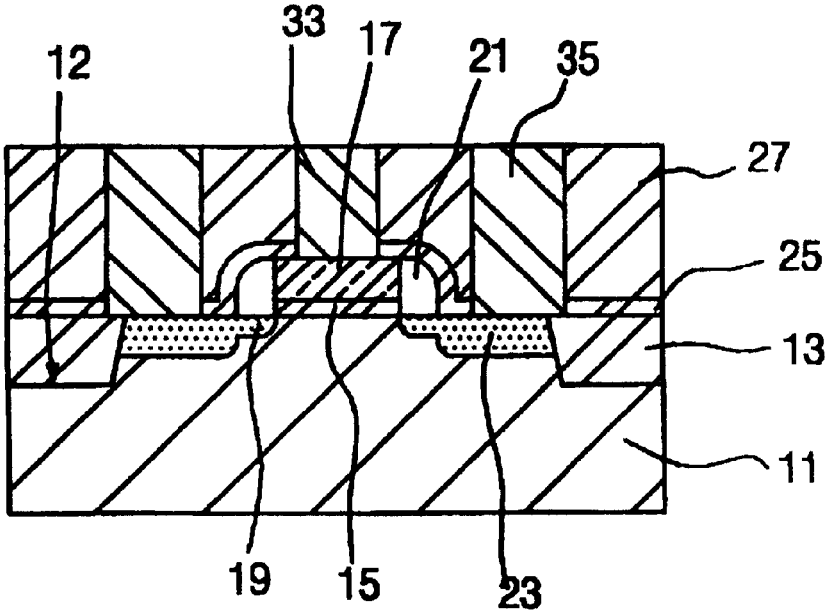
FIG. 1D RELATED ART

Referring to FIG. 1D, an electrically-conductive substance such as polysilicon, [Al] *aluminum*, and the like is deposited on the second insulating [interlayer] *layer* 27 *and through the first and second contact holes 29 to 31* to be [contacted] *brought into contact* with the gate 17 and heavily [of] doped regions 23 [through the first and second contact holes 29 and 31]. Then, [a first and a] *first and* second [plug] *plugs* 33 and 35 are formed in the first and second contact holes 29 and 31, respectively, by removing the electrically-conductive substance *through chemical mechanical polishing* (*CMP*) to expose the surface of the second insulating [interlayer] *layer* 27[by chemical-mechanical polishing (hereinafter abbreviated CMP)].

[The] *In the* above-mentioned method [of] *for* fabricating a semiconductor device [prevents] *according to the conventional art, in order to define the first and second contact holes which expose the gate and heavily doped regions, the second layer is over-etched to expose portions of the first insulating layer which correspond to the heavily doped regions, and then the first insulation layer dielectric is etched, whereby* the field oxide layer *is prevented* from being etched[by overetching the second insulating interlayer to expose portions of the first insulating interlayer corresponding to the heavily doped regions for forming the first and second contact holes exposing the gate and heavily doped regions and by etching the first insulating interlayer successively].

[Unfortunately] *However*, the method [of] *for* fabricating a semiconductor device [of the related art causes] *suffers from defects in that a* leakage current *is likely to be generated* due to [the] *a* difference in heat expansion coefficient between the semiconductor substrate and the first insulating [interlayer] *layer made* of silicon nitride as well as *due to* stress caused by lattice mismatch.

SUMMARY OF THE INVENTION

Accordingly, the present invention is directed to a method of fabricating a semiconductor device that substantially obviates one or more of the proulenis due to limitations and disadvantages of the related art.

[The] *An* object of the present invention is to provide a method [of] *for* fabricating a semiconductor device which prevents [the leakage current occurrence by avoiding the] stress *generation* due to [the] contact between [the] *a* semiconductor substrate and [insulating interlayer] *an insulation layer, so that a leakage current is not generated.*

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

[To] *In order to* achieve [these and other advantages and in accordance with the purpose of the present invention, as embodied and broadly described, the present invention includes] *the above object, according to one aspect of the present invention, there is provided a method for fabricating a semiconductor device, comprising* the steps of forming a field oxide layer [defining] *which defines* an active area and a field area, on a semiconductor substrate of a first conductive type, forming a gate on the active area of the semiconductor substrate by inserting a gate insulating layer between the semiconductor substrate and the gate, forming impurity regions of a second conductive type in the semiconductor substrate [in use of] *using* the gate as a mask, forming a first insulating [interlayer] *layer* on the semiconductor substrate by depositing an insulator of which heat expansion coefficient and lattice mismatch are less than those of the semiconductor substrate, to cover the field oxide layer and the gate, forming a second insulating [interlayer] *layer* on the first insulating [interlayer] *layer* by depositing another insulator of which *an* etch rate is different from that of the first insulating [interlayer] *layer*, forming a third insulating [interlayer] *layer* on the second insulating [interlayer] *layer* by depositing *still* another insulator of which *an* etch rate is different from that of the second insulating [interlayer] *layer*, and forming [a first contact hole] *first* and second contact holes *respectively* exposing the gate and [heavily doped] *impurity* regions [respectively] by *successively* patterning the third to first insulating [interlayer successively by] *layers through* photolithography.

[In another aspect, the present invention includes] *According to another aspect of the present invention, there is provided a method for fabricating a semiconductor device, comprising* the steps of forming a field oxide layer [defining] *which defines* an active area and a field area, on a semiconductor substrate of a first conductive type, forming a gate on the active area of the semiconductor substrate by inserting a gate insulating layer between the semiconductor substrate and the gate, [forming a sidewall spacer at a side of the gate,] forming lightly doped regions of a second conductive type in exposed portions of the semiconductor substrate, *forming a sidewall spacer at a side of the gate,* forming heavily doped regions of the second conductive type in the semiconductor substrate [in use of] *using* the gate as a mask [wherein] *so that* the heavily doped regions are *substantially* overlapped with the lightly doped regions, forming a first insulating [interlayer] *layer* on the semiconductor substrate by depositing an insulator of which heat expansion coefficient and lattice mismatch are less than those of the semiconductor substrate, to cover the field oxide layer and the gate, forming a second insulating [interlayer] *layer* on the first insulating [interlayer] *layer* by depositing another insulator of which *an* etch rate is different from that of the first insulating [interlayer] *layer*, forming a third insulating [interlayer] *layer* on the second insulating [interlayer] *layer* by depositing *still* another insulator of which *an* etch rate is different from that of the second insulating [interlayer] *layer*, forming [a first contact hole] *first* and second contact holes *respectively* exposing the gate and heavily doped regions [respectively] by *successively* patterning the third to first insulating [interlayer successively by] *layer through* photolithography, and forming first and second plugs in the first and second contact holes.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention. In the drawings:

FIG. 1A to FIG. 1D show cross-sectional views of fabricating a semiconductor device according to a related art; and FIG. 2A to FIG. 2D show cross-sectional views of fabricating a semiconductor device according to the present invention.

DETAILED DESCRIPTION OF PREFERRED EMBODIMENTS

Reference will now be made in detail to the preferred embodiments of the present invention, examples of which are illustrated in the accompanying drawings.

FIG. 2A to FIG. 2D show cross-sectional views of fabricating a semiconductor device according to the present invention.

Figure 2A:
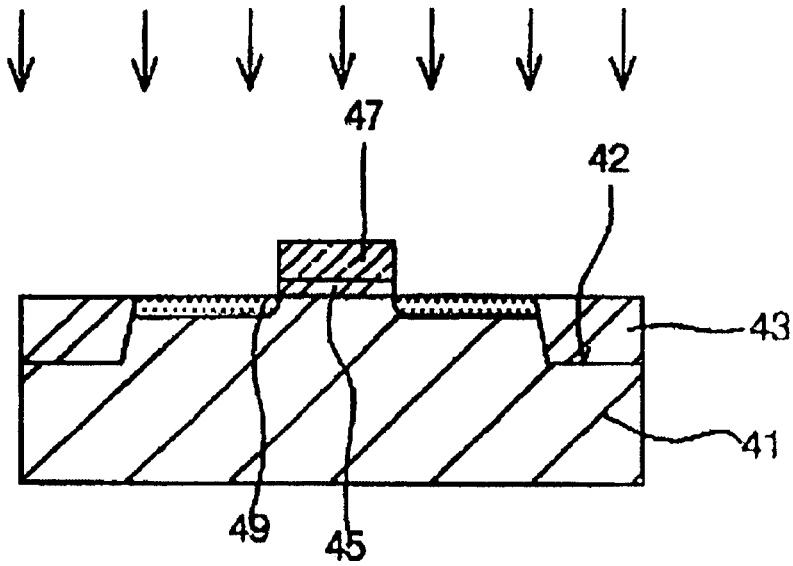

Referring to FIG. 2A, a field oxide layer 43 defining an active area and a field area of a device is formed on a p-typed semiconductor substrate 41 by shallow trench isolation (hereinafter abbreviated STI). In this case, the field oxide layer 43 is formed by forming a pad oxide layer(not shown in the drawing) and a mask layer(not shown in the drawing) which expose the field area on the semiconductor substrate 41, by forming trenches 42 which are slant to a predetermined degree by carrying out an anisotropic etch such as RIE and the like on the exposed parts of the semiconductor substrate 41, by filling the trenches with silicon oxide, then by removing the pad oxide and mask layers. Besides, the field oxide layer 41 may be formed by local oxidation of silicon(LOCOS).

After a gate oxide layer 45 has been formed on the active area of the semiconductor substrate 41, polysilicon doped with impurities is deposited on the gate insulating layer 45 by CVD. Then, a gate 47 is formed by patterning the polysilicon to remain on a predetermined portion of the semiconductor substrate 41 by photolithography including anisotropic etches such as RIE and the like.

Lightly doped regions 49 for LDD regions are formed by implanting ions lightly into the exposed portions of the semiconductor substrate 41 with n typed impurities such as P, As, etc, in use of the gate 17 as a mask.

Referring to FIG. 2B, a sidewall spacer 51 is formed at the sides of the gate 47. In this case, the sidewall spacer 51 is formed by deposing silicon oxide on the semiconductor substrate 41 to cover the field oxide layer 43 and gate 47 by CVD, then by etching back the silicon oxide to have the semiconductor substrate 41 exposed by RIE.

Heavily doped regions 53 for a source and a drain region are formed by implanting with n typed impurity ions such as P, As, etc, heavily into the exposed portions of the semiconductor substrate 41 in use of the gate 47 and sidewall spacer 51 as a mask.

Figure 2C:
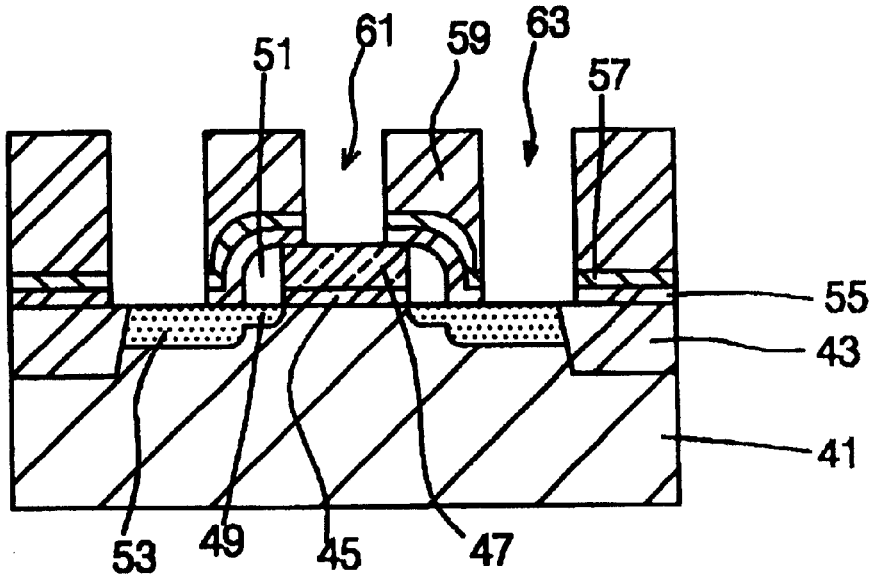

Referring to FIG. 2C, a first insulating [interlayer] *layer* 55 *which has a thickness of* 100 to 300 Å [thick] is formed by depositing silicon oxide on the semiconductor substrate 41 *by CVD* to cover the field oxide layer 43, gate 47, and sidewall [spacer 51 by CVD] *spacers 51*. In this case, a heat expansion coefficient and lattice mismatch of silicon oxide for the first insulating layer 55 against the semiconductor substrate 41 are less than those of silicon nitride, thereby reducing *a* leakage current due to stress.

And, a second insulating [interlayer] *layer* 57 *which has a thickness of* 100 to 300 Å [thick] is formed by depositing silicon nitride of which *an* etch rate is different *from* that of silicon oxide on the first insulating layer 55 [by] *through* CVD.

Then, a third insulating [interlayer] *layer* 59 *which has a thickness of* 500 to 10000 Å [thick] is formed by depositing silicon oxide or BPSG (boro phospho silicate glass) on the second insulating [interlayer] *layer* 57 by CVD or by coating *SOG* (*spin on glass*) *on* the second insulating layer57 [with SOG(spin on glass)].

[As] *Since* the surface of the third insulating [interlayer] *layer* 59 becomes even, [the] *respective* portions of the third insulating [interlayer] *layer* 59 corresponding to the gate 47 and the heavily doped regions 53 differ in thickness. Namely, the portion of the third insulating [interlayer] *layer* 59 corresponding to the heavily doped regions 59 is thicker than the [other] portion *of the third insulating layer 59* corresponding to the gate 47. [In this case,] *It is to be readily understood that* the third insulating [interlayer] *layer* 59 may be formed [with at least double] *by one or more* layers of the above-mentioned substances.

[A first and a second contact hole] *First and second contact holes* 61 and 63 *respectively* exposing the gate 47 and heavily doped regions 53 [respectively] are formed by *successively* patterning the third, second, and first insulating [interlayers] *layers* 59, 57, and 55 [successively by] *through* photolithography including [an] anisotropic [etch] *etching* such as RIE and the like.

When the first and second contact holes 61 and 63 are formed, portions of the second insulating [interlayer] *layer* 57 corresponding to the heavily doped regions 53 are exposed by [overetching] *over-etching* the third insulating [interlayer] *layer* 59 with a gas of [C2F6 or C4F8] $C_2F_6$ *or* $C_4F_8$ which is mixed with [O2] $O_2$. In this case, the second insulating layer 57 of which *an* etch rate is different from that of the third insulating layer 59 is used as an etch-stop layer.

After the exposed portions of the second insulating [interlayer] *layer* 57 has been etched by [C2HF6O2] $C_2HF_6O_2$, the first and second contact holes 61 and 63 are formed by etching the first insulating layer 55 to expose the semiconductor substrate 41 [in use of] *using* the gas of [C2F6 or C4F8] $C_2F_6$ *or* $C_4F_8$ which is mixed with [O2. which has been used for] $O_2$ *as in the case of* etching the third insulating [interlayer] *layer* 59. In this case, *due to the fact that it is easy to control an etching end point owing to thinness of the first insulation layer 55,* the field oxide layer 43 is prevented from being damaged[because it is easy to control the etch-end point owing to the thin first insulating interlayer 55].

Figure 2D:
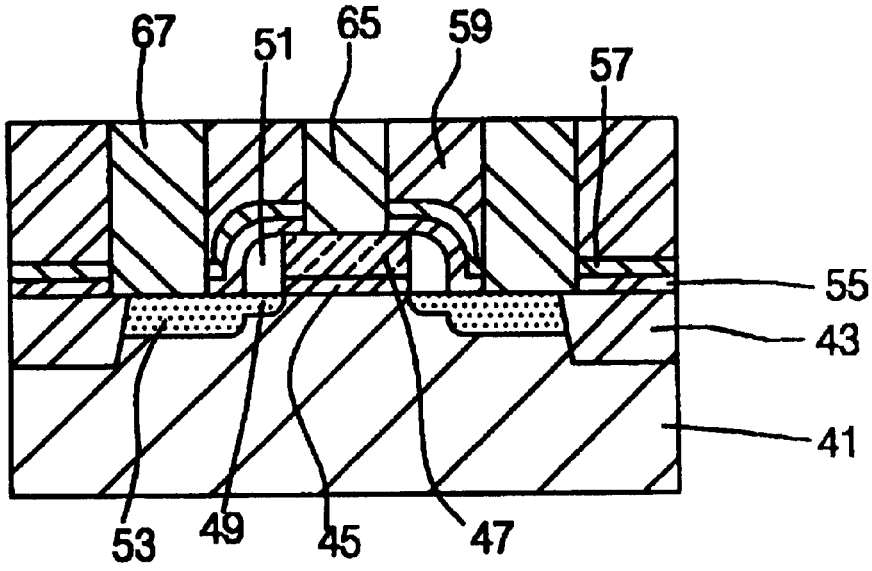

Referring to FIG. 2D, an electrically-conductive substance such as polysilicon, [Al] *aluminum*, and the like is deposited on the third insulating [interlayer] *layer* 59 *and through the first and second contact holes 61 and 63* by CVD to be [contacted] *brought into contact* with the gate 47 and heavily doped regions 53[through the first and second contact holes 61 and 63]. Then, [a first and a second plug] *first and second plugs* 65 and 67 are formed in the first and second contact holes 61 and 63, respectively, by removing the electrically-conductive substance *through CMP* to expose the surface of the third insulating [interlayer] *layer* 59[by CMP].

[As mentioned in] *As apparent from* the above description [of] *in* the method of fabricating a semiconductor device [of] *according to* the present invention, a first insulating layer *made* of silicon oxide of which heat expansion coefficient and lattice mismatch are less than those of silicon nitride is formed on a semiconductor substrate, and a second insulating [interlayer] *layer made* of silicon nitride used as an etch-stop layer and a third insulating [interlayer] *layer made* of silicon oxide are formed on the first insulating [interlayer] *layer* successively.

And, [a first and a second contact hole] *a first and second holes* exposing a gate and heavily doped regions are formed by patterning the third to first insulating [interlayers] *layers* by photolithography in order, wherein the third insulating [interlayer are overetched] *layer is over-etched* to expose a portion of the second insulating [interlayer] *layer* corresponding to the heavily doped regions. In this case, the second insulating [interlayer] *layer* used as an etch-stop layer prevents the first insulating [interlayer] *layer* and field oxide layer from being etched.

Accordingly, the present invention prevents [the] *a* leakage current [occurrence] *from being generated* by avoiding the stress *generation* due to [the] contact between the semiconductor substrate and insulating [interlayer] *layer*.

It will be apparent to those skilled in the art that various modifications and variations can be made in a method of fabricating a semiconductor device of the present invention without departing from the spirit or scope of the inventions. Thus, it is intended that the present invention cover the modifications and variations of this invention provided they come within the scope of the appended claims and equivalents.

What is claimed is:

1. A method of fabricating a semiconductor device comprising the steps of:

forming a field oxide layer[defining], *which defines* an active area and a field area on a semiconductor substrate of a first conductive type;

forming a gate on the active area of the semiconductor substrate by inserting a gate insulating layer between the semiconductor substrate and the gate;

forming impurity regions of a second conductive type in the semiconductor substrate [in use of] *using* the gate as a mask;

forming a first insulating [interlayer] *layer* on the semiconductor substrate by depositing an insulator of which heat expansion coefficient and lattice mismatch are less than those of the semiconductor substrate to cover the field oxide layer and the gate;

forming a second insulating [interlayer] *layer* on the first insulating [interlayer] *layer* by depositing another insulator of which *an* etch rate is different from that of the first insulating [interlayer] *layer*;

forming a third insulating [interlayer] *layer* on the second insulating [interlayer] *layer* by depositing *still* another insulator of which *an* etch rate is different from that of the second insulating [interlayer] *layer*; and forming a first contact hole and second contact holes *respectively* exposing the gate and [heavily doped] *impurity* regions [respectively] by *successively* patterning the third to first insulating [interlayer successively by] *layers through* photolithography,

*wherein the second insulating layer is etched by* $C_2HF_6O_2$, *and*

*wherein the successive patterning of the third to first insulating layers excludes portions of the third to first insulating layers formed above the field oxide layer such that the portions of the third to first insulating layers formed above the field oxide layer prevent the etching of the field oxide layer.*

2. The method of fabricating a semiconductor device according to claim 1, wherein the field oxide layer is formed by shallow trench isolation or by local oxidation of silicon.

3. The method of fabricating a semiconductor device according to claim 1, wherein the first insulating [interlayer] *layer* is formed by depositing silicon oxide *to a thickness of* 100 to 300 Å[thick].

4. The method of fabricating a semiconductor device according to claim 3, wherein the first insulating [interlayer] *layer* is etched by a mixed gas of [(C2F6+O2) or (C4F8+O2)] ($C_2F_6$+$O_2$) *or* ($C_4F_8$+$O_2$).

5. The method of fabricating a semiconductor device according to claim 1, wherein the second insulating [interlayer] *layer* is formed by depositing silicon nitride *to a thickness of* 100 to 300 Å[thick].

[6. The method of fabricating a semiconductor device according to claim 5, wherein the second insulating interlayer is etched by C2HF6O2.]

7. The method of fabricating a semiconductor device according to claim 1, wherein the third insulating [interlayer] *layer* is formed by depositing silicon oxide or boro phospho silicate glass or by coating [with] spin on glass.

8. The method of fabricating a semiconductor device according to claim 7, wherein the third insulating [interlayer of a single] layer is formed with one *or more layers made* of silicon oxide, boro phospho silicate glass, or spin on glass[or wherein the third insulating interlayer of at least double layers is formed with silicon oxide, boro phospho silicate glass and spin on glass].

9. The method of fabricating a semiconductor device according to claim 7, wherein a surface of the third insulating [interlayer] *layer* is formed to be even.

10. The method of fabricating a semiconductor device according to claim 7, wherein the third insulating [interlayer] *layer* is etched by a mixed gas of [(C2F6+O2) or (C4F8+O2)] ($C_2F_6$+$O_2$) *or* ($C_4F_8$+$O_2$).

11. The method of fabricating a semiconductor device according to claim 10, wherein the third insulating [interlayer] *layer* is [overetched] *over-etched* to expose the second insulating [interlayer] *layer* corresponding to the [heavily doped] *impurity* regions.

12. The method of fabricating a semiconductor device according to claim 1, [the method] further comprising the step of forming first and second plugs in the first and second contact holes.

13. A method of fabricating a semiconductor device comprising the steps of forming a field oxide layer [defining] *which defines* an active area and a field area on a semiconductor substrate of a first conductive type;

forming a gate on the active area of the semiconductor substrate by inserting a gate insulating layer between the semiconductor substrate and the gate;

[forming a sidewall spacer at a side of the gate;]

forming lightly doped regions of a second conductive type in exposed portions of the semiconductor substrate;

*forming a sidewall spacer at a side of the gate;* forming heavily doped regions of the second conductive type in the semiconductor substrate [in use of] *using* the gate *and sidewall spacer* as a mask [wherein] *so that* the heavily doped regions are overlapped with the lightly doped regions;

forming a first insulating [interlayer] *layer* on the semiconductor substrate by depositing an insulator of which heat expansion coefficient and lattice mismatch are less than those of the semiconductor substrate to cover the field oxide layer and the gate;

forming a second insulating [interlayer] *layer* on the first insulating [interlayer] *layer* by depositing another insulator of which *an* etch rate is different from that of the first insulating [interlayer] *layer*;

forming a third insulating [interlayer] *layer* on the second insulating [interlayer] *layer* by depositing *still* another insulator of which *an* etch rate is different from that of the second insulating [interlayer] *layer*;

forming [a first contact hole] *first* and second contact holes *respectively* exposing the gate and heavily doped regions [respectively] by *successively* patterning the third to first insulating [interlayer successively by] *layers through* photolithography; and forming first and second plugs in the first and second contact holes,

*wherein the second insulating layer is etched by* $C_2HF_6O_2$, *and*

*wherein the successive patterning of the third to first insulating layers excludes portions of the third to first insulating layers formed above the field oxide layer such that the portions of the third to first insulating layers formed above the field oxide layer prevent the etching of the field oxide layer.*

*14. A method of fabricating a semiconductor device comprising the steps of:*

*forming a field oxide layer, which defines an active area and a field area on a semiconductor substrate of a first conductive type;*

*forming a gate on the active area of the semiconductor substrate by inserting a gate insulating layer between the semiconductor substrate and the gate;*

*forming impurity regions of a second conductive type in the semiconductor substrate using the gate as a mask;*

*forming a first insulating layer on the semiconductor substrate by depositing an insulator of which heat expansion coefficient and lattice mismatch are less than those of the semiconductor substrate to cover the field oxide layer and the gate;*

*forming a second insulating layer on the first insulating layer by depositing another insulator of which an etch rate is different from that of the first insulating layer;*

*forming a third insulating layer on the second insulating layer by depositing still another insulator of which an etch rate is different from that of the second insulating layer, the third insulating layer comprising two or more layers among silicon oxide, boro phospho silicate glass, and spin on glass; and*

*forming a first contact hole and second contact holes respectively exposing the gate and impurity regions by successively patterning the third to first insulating layers through photolithography,*

*wherein the successive patterning of the third to first insulating layers excludes portions of the third to first insulating layers formed above the field oxide layer such that the portions of the third to first insulating layers formed above the field oxide layer prevent the etching of the field oxide layer.*

*15. The method of fabricating a semiconductor device according to claim 14, wherein the field oxide layer is formed by shallow trench isolation or by local oxidation of silicon.*

*16. The method of fabricating a semiconductor device according to claim 14, wherein the first insulating layer is formed by depositing silicon oxide to a thickness of 100 to 300 Å.*

*17. The method of fabricating a semiconductor device according to claim 16, wherein the first insulating layer is etched by a mixed gas of* $(C_2F_6+O_2)$ *or* $(C_4F_8+O_2)$.

*18. The method of fabricating a semiconductor device according to claim 14, wherein the second insulating layer is formed by depositing silicon nitride to a thickness of 100 to 300 Å.*

*19. The method of fabricating a semiconductor device according to claim 18, wherein the second insulating layer is etched by* $C_2HF_6O_2$.

*20. The method of fabricating a semiconductor device according to claim 14, wherein the third insulating layer is formed by depositing silicon oxide or boro phospho silicate glass or by coating spin on glass.*

*21. The method of fabricating a semiconductor device according to claim 20, wherein a surface of the third insulating layer is formed to be even.*

*22. The method of fabricating a semiconductor device according to claim 20, wherein the third insulating layer is etched by a mixed gas of* $(C_2F_6+O_2)$ *or* $(C_4F_8+O_2)$.

*23. The method of fabricating a semiconductor device according to claim 22, wherein the third insulating layer is over-etched to expose the second insulating layer corresponding to the impurity regions.*

*24. The method of fabricating a semiconductor device according to claim 14, further comprising the step of forming first and second plugs in the first and second contact holes.*

*25. A method of fabricating a semiconductor device comprising the steps of*

*forming a field oxide layer which defines an active area and a field area on a semiconductor substrate of a first conductive type;*

*forming a gate on the active area of the semiconductor substrate by inserting a gate insulating layer between the semiconductor substrate and the gate;*

*forming lightly doped regions of a second conductive type in exposed portions of the semiconductor substrate;*

*forming a sidewall spacer at a side of the gate;*

*forming heavily doped regions of the second conductive type in the semiconductor substrate using the gate and sidewall spacer as a mask so that the heavily doped regions are overlapped with the lightly doped regions;*

*forming a first insulating layer on the semiconductor substrate by depositing an insulator of which heat expansion coefficient and lattice mismatch are less than those of the semiconductor substrate to cover the field oxide layer and the gate;*

*forming a second insulating layer on the first insulating layer by depositing another insulator of which an etch rate is different from that of the first insulating layer;*

*forming a third insulating layer on the second insulating layer by depositing still another insulator of which an etch rate is different from that of the second insulating layer, the third insulating layer comprising two or more layers among silicon oxide, boro phospho silicate glass, and spin on glass;*

*forming first and second contact holes respectively exposing the gate and heavily doped regions by successively patterning the third to first insulating layers through photolithography; and*

*forming first and second plugs in the first and second contact holes,*

*wherein the successive patterning of the third to first insulating layers excludes portions of the third to first insulating layers formed above the field oxide layer such that the portions of the third to first insulating layers formed above the field oxide layer prevent the etching of the field oxide layer.*

* * * * *